(12) United States Patent
Sugaya et al.

(10) Patent No.: US 7,652,310 B2
(45) Date of Patent: Jan. 26, 2010

(54) NEGATIVE RESISTANCE FIELD EFFECT DEVICE AND HIGH-FREQUENCY OSCILLATION DEVICE

(75) Inventors: Takeyoshi Sugaya, Tsukuba (JP); Kazuhiro Komori, Tsukuba (JP)

(73) Assignees: Japan Science and Technology Agency, Saitama (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/064,371

(22) PCT Filed: Aug. 25, 2006

(86) PCT No.: PCT/JP2006/316746

§ 371 (c)(1),
(2), (4) Date: Nov. 10, 2008

(87) PCT Pub. No.: WO2007/026616

PCT Pub. Date: Mar. 8, 2007

(65) Prior Publication Data

US 2009/0127542 A1    May 21, 2009

(30) Foreign Application Priority Data

Aug. 31, 2005    (JP) .............................. 2005-250526

(51) Int. Cl.
*H01L 31/00* (2006.01)
(52) U.S. Cl. ..................................... 257/192
(58) Field of Classification Search ................. 257/192, 257/E27.002, E47.001
See application file for complete search history.

(56) References Cited

U.S. PATENT DOCUMENTS 6,559,470 B2 *    5/2003    Tsu-Jae ....................... 257/17

(Continued)

FOREIGN PATENT DOCUMENTS

JP        62-245681        10/1987

(Continued)

OTHER PUBLICATIONS

J.Phillips, K. Kamath, T. Brock, and P. Bhattacharaya, Characteristics of InAs/AlGaAs self-organized quantum dot modulation doped field effect transistors, Applied Physics Letters, vol. 72, No. 26, pp. 3509-3511, Jun. 29, 1998.

(Continued)

*Primary Examiner*—Calvin Lee
(74) *Attorney, Agent, or Firm*—Matthew F. Lambrinos (57) ABSTRACT

There is provided a 3-terminal negative differential resistance field effect element having a high output and high frequency characteristic, requiring low power consumption, and preferably having a high PVCR. The field effect element uses a compound hetero structure and forms a dual channel layer by connecting a high-transfer degree quantum well layer (13) to a low-transfer degree quantum dot layer (15) via a barrier layer (14) on a substrate (11). Under existence of an electric field obtained by voltage application to a gate electrode (17), the negative resistance field effect element (10) changes a carrier accelerated by a drain voltage applied to a drain electrode (19) from a high-transfer degree channel to a low-transfer degree channel by the tunnel effect or over the barrier layer, thereby exhibiting negative differential resistance for the drain current and changing the negative resistance inclination by the gate voltage.

16 Claims, 4 Drawing Sheets

U.S. PATENT DOCUMENTS 7,221,005 B2 * 5/2007 Ogura et al. ............. 257/192
7,442,971 B2 * 10/2008 Wirbeleit et al. ............ 257/287

FOREIGN PATENT DOCUMENTS

| JP | 2703892/63-144579 | 6/1988 |
| JP | 2001-185559 A | 7/2001 |
| JP | 2002-299637 A | 10/2002 |
| JP | 2004-349538 A | 12/2004 |

OTHER PUBLICATIONS

Y. Ohno, M. Tsuchiya, H.Sakaki, Gigantic negative transconductance and mobility modulation in a double-quantum-well-structure via gate-controlled resonant coupling, Applied Physics Letters, vol. 62(16), pp. 1952-1954, Apr. 19, 1993.

Chang-Luen Wu and Wei-Chou Hsu, Enhanced Resonant Tunneling Real-Space Transfer in -Doped GaAs/InGaAs Gated Dual-Channel Transistors Grown by MOCVD, IEEE Transactions on Electron Devices, vol. 43, No. 2, pp. 207-212, Feb. 1996.

Lee C-S, Chen H-H, Hsu W-C, Huang J-C, Chen Y-J, Monolithic AlAs-InGaAs-InGaP-GaAs HRT-FETs with PVCR at 960 at 300K, IEEE Electron Device Lett, vol. 26. No. 2, p. 50-52 (Feb. 2005).

* cited by examiner (A)

NEGATIVE RESISTANCE FIELD EFFECT DEVICE AND HIGH-FREQUENCY OSCILLATION DEVICE

TECHNICAL FIELD

The present invention relates to a negative resistance field effect device and a high-frequency oscillation device, and particularly to a dual-channel (double-channel) negative resistance field effect device and a high-frequency oscillation device, which has a field effect device structure having source and drain electrodes and a gate electrode yet can exhibit NDR (Negative Differential Resistance). Incidentally, a field effect device capable of exhibiting negative differential resistance is simply called a negative resistance field effect device in the present specification in accordance with general custom.

BACKGROUND ART

In a semiconductor integrated circuit, there is a case where a device having negative differential resistance is required. Similarly to another active device, also in such a negative resistance device, it is, of course, desirable that the device operates at a lower voltage and operates at a high speed (high-frequency characteristic is excellent), and various researches have been carried out until now.

However, that there is no control terminal is, in itself, liable to become a problem, there is a limit in control from outside, and it can be unsuitable for application to a logical device or as an integrated device. Besides, an amplifying function or the like cannot be naturally expected. Accordingly, after all, a negative resistance device having a three-terminal structure including at least a control terminal is required, and under the premise, as a future tendency, it appears that primary importance is attached to the realization of a low voltage operation, a high output and a high PVCR.

As one countermeasure against that, hitherto, there is proposed a structure in which a compound heterojunction structure is used, a layer portion having a relatively narrow energy band gap and a high mobility is made a main transit channel for electrons, and a layer portion having a relatively wide energy band gap and a low mobility is provided as a second channel to come in contact with this (see, for example, non-patent document 1). Alternatively, there is a trial in which delta doping is applied to only one of double channels of the same material, and negative resistance is realized by a difference in the mobility (see, for example, non-patent document 2).

In a low dimensional field effect device having the dual-channel structure as stated above, a transit electron (hot carrier) that is accelerated by a drain voltage and reaches the energy level of a potential barrier between both the channels is real-space transferred to a low-mobility channel sandwiched between the gate and the main high-mobility channel by applying a positive gate voltage. The electron transferred to the low-mobility channel is decelerated and transits or is stopped, and as a result, the planar density of electrons passing through the high-mobility channel is obtained by subtracting the electric charge accumulated in the low-mobility channel from the total amount of electric charge induced to satisfy a charge neutrality condition by the gate voltage. The same effect as biasing the gate bias by the amount in the negative direction is produced, and electrons in the high-mobility channel are reduced so that the drain current is substantially decreased, and the negative differential resistance occurs.

On the other hand, part of the present inventors has already proposed that in order to realize such principle, a dual-channel field effect device structure using a quantum wire for the high-mobility channel is advantageous to suppress scattering of carriers in the channel (see patent document 1). Further, in order to obtain this quantum wire, there is also proposed a method in which the quantum wire with a very small width and very small thickness can be formed without being limited by normal lithography (see patent document 2). Besides, there is proposed that a higher PVCR can be obtained by forming a quantum wire and a quantum well in the same process (see patent document 3).

Further, non-patent document 3 discloses a report example in which a high-mobility quantum well layer and a quantum dot are made adjacent to each other and negative resistance is observed.

Non-patent document 1: "Enhanced Resonant Tunneling Real-Space Transfer in delta-Doped GaAs/InGaAs Gated Dual-Channel Transistors Grown by MOCVD", Chang-Luen Wu et al., IEEE Transactions on Electron Devices vol. 43 No. 2 (1996) 207)

Non-patent document 2: "Gigantic negative transconductance and mobility modulation in a double-quantum-well structure via gate-controlled resonant coupling", Y Ohno et al., Appl. Phys. Lett. vol. 62 No. 16 (1993) 1952.

Non-patent document 3: J. Phillips et al., "Characteristics of InAs/AlGaAs self-organized quantum dot modulation doped field effect transistors", Appl. Phys. Lett. Vol. 72, No. 26, 3509-3511 (29 Jun. 1998)

Patent document 1: JP-A-2001-185559
Patent document 2: JP-A-2002-299637
Patent document 3: JP-A-2004-349538

DISCLOSURE OF THE INVENTION

Problems that the Invention is to Solve

However, in the non-patent document 2, a barrier layer of 2.5 nm is sandwiched between channels of 10 nm and 15 nm, the channel of 10 nm is doped with a carrier to obtain a low mobility, and the transit channel is changed by the gate electrode, however, a remarkable negative resistance does not occur.

Besides, in the proposed low dimensional field effect device having the dual-channel structure, a voltage of 1 V or higher is required for the drain voltage, and it can not be said to be a low power consumption device. In order to make a low power consumption device, this must be reduced. Besides, it is necessary to raise a high frequency characteristic, and also in this point, this conventional device is not satisfactory. Further it is desirable that a peak-to-valley current ratio (PVCR) is high, which is the ratio of a drain current just before the occurrence of the negative differential resistance to a drain current just after that and becomes a reference for estimating the magnitude of a negative resistance effect.

Besides, like the conventional field effect device, the confinement size in the lateral direction can be made smaller than about 100 nm by using the quantum wire for the high-mobility channel, and as compared with the past, it becomes possible to realize the negative differential resistance by a far less power voltage. However, since the quantum wire with a small size is used, a current value at the time of negative resistance is at most the order of several tens of micro-amperes, and for example, in the case where it is applied as a high-frequency oscillation device, the output is low, and there has been scope for improvement.

In view of the above, the invention has an object to enable negative differential resistance to be exhibited by a low power source voltage (drain voltage (source-drain voltage or earth-drain voltage)), and further to increase a drain current value just before the negative differential resistance is exhibited and to improve the power as a high-frequency oscillation device. More desirably, the invention has an object to increase a peak-to-valley current ratio (PVCR) which is the ratio of a drain current just before the occurrence of the negative differential resistance and a drain current just thereafter and becomes a reference for estimating the magnitude of a negative resistance effect.

Means for Solving the Problems

In order to achieve the objects, in the invention, as a compound semiconductor laminate structure, there is proposed a dual-channel structure in which a high quality quantum well is used as a high-mobility channel, a quantum dot is used as a low-mobility channel, those are formed at both sides of a barrier layer having such a thickness that a carrier can tunnel. That is, an electron transit in the high-mobility channel layer is accelerated by a drain voltage and is transferred to the low-mobility layer, so that the negative resistance is realized.

EFFECTS OF THE INVENTION

In the non-patent document 1, although the potential barrier layer is used as the low-mobility layer, since an energy difference from the high-mobility layer is large, a voltage at which the negative resistance occurs becomes high. On the other hand, in the invention, since the quantum dot layer, which has an intermediate energy level between the high-mobility layer and the potential barrier layer, is made the low-mobility layer, the occurrence voltage can be made low (the quantum dot layer will be described later). In the device of the invention, the thickness of the low-mobility channel is made as sufficiently thin as 2 nm, and the transit channel is changed by the drain voltage, so that a remarkable negative resistance can be realized.

Besides, even if the energy level of the low-mobility layer is lower than the high-mobility layer, a carrier is previously made to transit in the high-mobility layer by the gate electrode, so that the negative resistance can be made to occur. In the invention, differently from the patent documents 1 to 3, since the negative resistance can be made to occur without being limited by the channel width, as a result, a device having a large current value can be formed, and a high output device can be realized.

Further, in the non-patent document 3, the energy level of the quantum dot is used to real-space transfer the carrier to the low-mobility barrier layer, and as the occurrence mechanism of the negative resistance, it occurs from the mobility difference between the high-mobility quantum well and the low-mobility barrier layer. In this point, the non-patent document 3 has the same real-space transfer mechanism as the non-patent document 1. Besides, in the non-patent document 3, the energy level of the quantum dot is at the lowest position in energy, and electrons are liable to be accumulated in the quantum dot layer, and accordingly, the structure is such that the negative resistance is hard to cause. Accordingly, the negative resistance occurrence voltage is as high as 1 V, and the PVCR is also low.

On the other hand, in the invention, the quantum dot layer is used as the low-mobility layer, and this point is the point most different from the related art such as the non-patent document 3. Further, in the invention, since the energy level of the quantum dot is positioned between the high-mobility quantum well and the barrier layer, the negative resistance occurrence voltage is low, and further, since the very low-mobility layer of the quantum dot can be used, there is a remarkable effect that the PVCR can also be made large.

BEST MODE FOR CARRYING OUT THE INVENTION

1. Structure of Negative Resistance Field Effect Device

Figure 1:
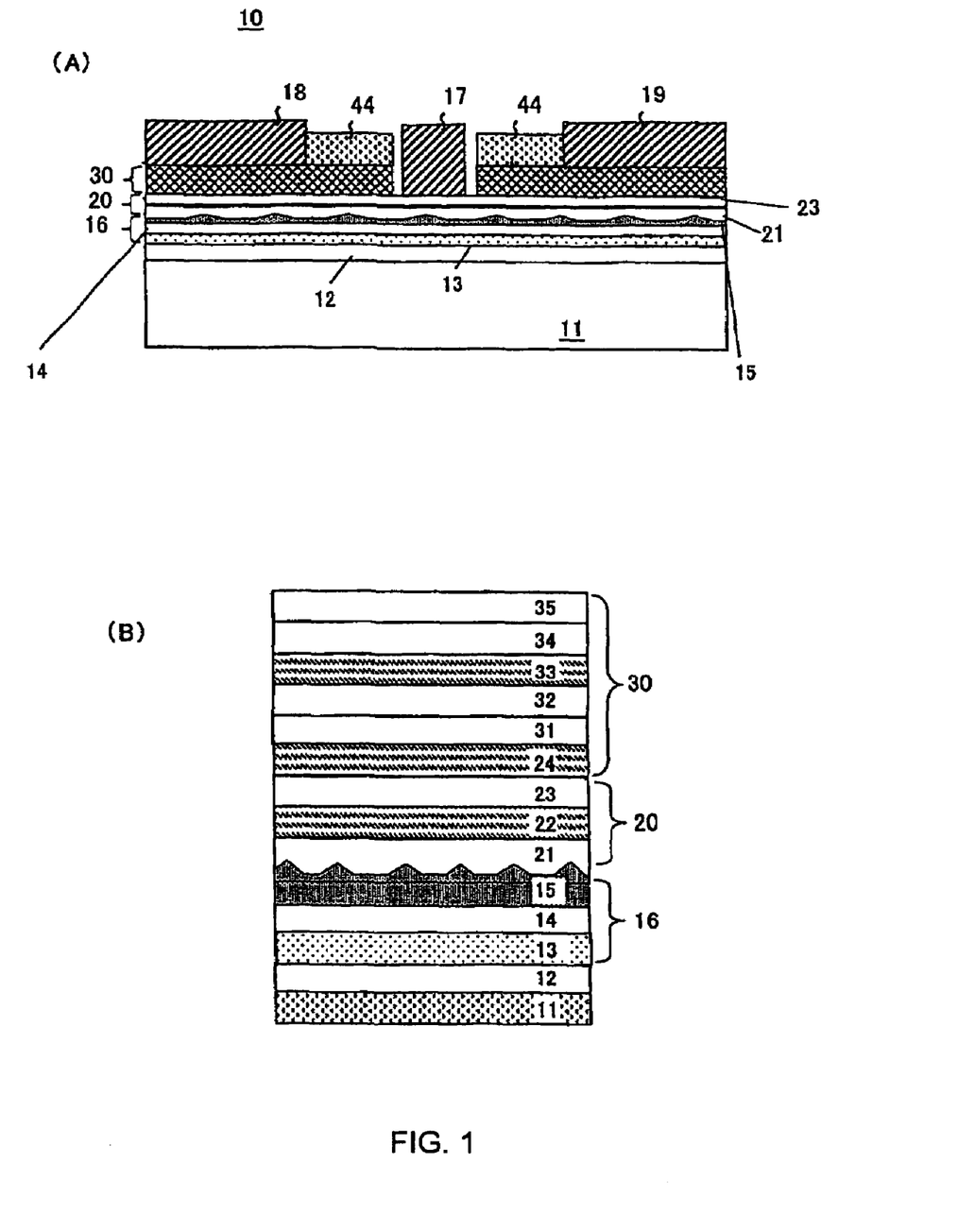
FIG. 1 A schematic structural view of an embodiment of a dual-channel negative resistance field effect device.

FIG. 1 is a schematic structural view of an embodiment of a dual-channel negative resistance field effect device. FIG. 1(A) shows the outline of a sectional structure of the dual-channel negative resistance field effect device 10, and FIG. 1(B) shows a detailed sectional layer structure.

The dual-channel negative resistance field effect device 10 includes an InP substrate 11, an InAlAs buffer layer 12, a double-channel layer 16, a gate Schottky layer 20, a contact layer 30, a gate electrode 17, a source electrode 18, a drain electrode 19, and an $SiO_2$ oxide film 44. Incidentally, the materials of the respective layers are merely examples, and suitable materials can be used. For example, as the substrate, instead of the InP substrate 11, a lattice-matched GaAs substrate may be used, and as the buffer layer 12, AlGaAs may be used. In that case, a GaAs layer may be used as a high-mobility layer 13 of the double-channel layer 16, and an AlGaAs layer may be used as a low-mobility layer 15, however, the Al composition of the low-mobility layer 15 is selected to be lower than the composition of the buffer layer 12. The $SiO_2$ oxide film 44 may be omitted. Further, the structure of the gate Schottky layer 20 and the contact layer 30 are merely examples, and a suitable layer structure can be adopted.

The dual-channel layer 16 includes the high-mobility quantum well layer 13, an $In_{0.52}Al_{0.48}As$ barrier layer 14, and the low-mobility quantum dot layer 15. The substrate is the InP(001) substrate 11, and after the $In_{0.52}Al_{0.48}As$ buffer layer 12 is grown, as a high-mobility channel of a main transit channel for electrons, the $In_{0.53}Ga_{0.47}As$ quantum well layer 13 lattice-matched to the substrate is used.

The quantum well layer 13 is lattice-matched to the substrate 11, so that a high mobility can be obtained. Alternatively, although the quantum well layer 13 is not lattice-matched to the substrate 11, when the strain is not relaxed and the surface keeps a flat state, the high mobility can be obtained.

The quantum dot layer 15 is made of a compound semiconductor having a lattice constant different from the substrate 11, and the thickness is made thin as compared with the quantum well layer 13, so that the low mobility can be obtained. Alternatively, the thickness of the quantum dot layer 15 is made not larger than the critical thickness and is made sufficiently thin although there is no roughness, so that the electron mobility can be sufficiently made low. Alternatively, the quantum dot layer 15 is made of a semiconductor layer lattice-matched to the substrate 11, and the film thickness is made sufficiently thin, so that the electron mobility can be made low. Alternatively, the quantum dot layer 15 is made to have many roughnesses on the surface, so that the low mobility can be obtained.

Here, when the strain of the quantum well layer 13 is not relaxed and the surface state is flat, the In composition is increased, and the quantum well layer 13 having a further high mobility can be adopted. The non-doped $In_{0.52}Al_{0.48}As$ barrier layer 14 is so thin that a carrier can tunnel, and in this embodiment, the thickness is, as an example, 2 nm. When this condition is satisfied, the thickness can be changed. The low-mobility channel quantum dot layer 15 is made of an $In_{0.23}Ga_{0.77}As$ layer of 2 nm. The quantum dot layer 15 has a tendency that as the In composition is made small as compared with the high-mobility quantum well layer 13, the mobility becomes low, however, even in the case where the In composition is made high, when the thickness is made further thin, the low-mobility channel layer can be obtained.

Here, the quantum dot layer 15 is a semiconductor layer not lattice-matched to the substrate, many roughnesses exist on its surface, which prevent the movement of electrons to form the low-mobility channel, and the negative resistance occurs. Besides, the thickness of the quantum dot layer 15 is not larger than the critical thickness and even if there is no roughness, it is sufficient if the thickness is sufficiently thin (for example, approximately half or less of the quantum well layer 13) and an electron has a sufficiently low mobility. Further, even if the quantum dot layer 15 is a semiconductor layer lattice-matched to the substrate, when the quantum well has a sufficiently thin film thickness and an electron mobility is low, the negative resistance can occur. Incidentally, the term "quantum dot" is used in order to indicate that the layer of the low-mobility channel is as thin as, for example, 2 nm.

Besides, in FIG. 1, although the quantum dot layer 15 is positioned at the gate electrode side when viewed from the quantum well layer 13, it may be made reversed.

The gate Schottky layer 20 as a laminate structure having, as an uppermost layer, a gate Schottky junction layer or a gate insulating film to the gate electrode 17 is provided on the dual-channel layer 16. In the illustrated case, the gate Schottky layer 20 includes, as an example, an InAlAs spacer layer 21 having a relatively wide energy band gap as compared with the dual-channel layer 16, a delta doped layer (δ-doped layer) 22 advantageous in carrier supply from the source electrode side with respect to the source electrode 18, and an InAlAs Schottky junction layer 23 capable of forming Schottky junction with the gate electrode 17. Incidentally, no limitation is made to this example, and instead of the Schottky junction layer 23 etc., a gate insulating layer may be used.

For contact with the source and drain electrodes 18 and 19, the following upper stack structure is further provided as the contact layer 30. The contact layer 30 in this embodiment is also a non-alloy contact layer including a laminate structure of plural layers. The contact layer 30 includes, in sequence from a lower layer, a delta doped layer 24 provided as necessary, an n-InAlAs layer 31, an n-InGaAs layer 32, a delta doped layer 33, an n-InAlAs layer 34, and an n-InAs layer 35. This is based on conditions that lattice matching is good, conductivity is good, and good ohmic contact with the source electrode and the drain electrode can also be achieved. However, a different laminate structure other than this is, of course, conceivable, and as long as the foregoing objects are achieved, the number of laminate layers and materials are arbitrary.

Besides, the InAlAs and InGaAs layers other than the dual-channel layer 16 can be made to have such composition that lattice matching to the InP substrate is achieved.

In FIG. 1, although the delta doped layer 22 is positioned at the gate electrode side of the double channel layer 16, also when formed at the substrate side, the same effect can be expected. Besides, it may be formed at both the gate side and the substrate side.

In the structure as stated above, under existence of an electric field obtained by voltage application to the gate electrode 17, the dual-channel negative resistance field effect device 10 transfers a carrier accelerated by a drain voltage applied to the drain electrode 18 from the high-mobility channel to the low-mobility channel by the tunnel effect or over the barrier layer, so that negative differential resistance is exhibited with respect to the drain current and the inclination of the negative resistance is changed by the gate voltage.

As stated above, in this embodiment, the high-mobility channel is made the quantum well layer 13, the low-mobility channel is made the quantum dot layer 15, the energy level difference between the quantum well layer 13 and the quantum dot layer 15 is provided at a midpoint of the level difference to the barrier layer 14, and further, a lattice mismatched system is adopted to reduce the electron mobility, so that a drain voltage $V_{NDR}$ at which the negative resistance occurs can be reduced as compared with the related art. Further, it is easy to obtain a high PVCR, and the amount of current can also be made large. In the negative resistance device using the quantum wire of the patent documents 1 to 3, there has been a problem that the amount of current is small, whereas in the device of the embodiment, since the main transit channel of electrons is the quantum well, the amount of current can be easily made large.

b 2. Manufacturing Method

In a trail example, after the $In_{0.52}Al_{0.48}As$ buffer layer 12 of 400 nm is grown on the InP substrate 11, the double-channel layer 16 including the $In_{0.53}Ga_{0.47}As$ high-mobility quantum well layer 13 of 10 nm, the $In_{0.52}Al_{0.48}As$ barrier layer 14 of 2 nm, and the $In_{0.23}Ga_{0.77}As$ low-mobility quantum dot layer 15 of 2 nm is formed. The thicknesses of growth layers thereafter are such that the InAlAs spacer layer 21 is 10 nm thick, the film thickness to the InAlAs Schottky junction layer 23 after the delta doped layer 22 is stacked is 15 nm, and with respect to the contact layer 30, the delta doped layer 24 and the n-InAlAs layer 31 thereon are 1 nm thick, the n-InGaAs layer 32 is 5 nm thick, the n-InAlAs layer 34 on the second delta doped layer 33 is 1 nm thick, and the uppermost layer of the n-InGaAs layer 35 is 1 nm thick.

Figure 2:
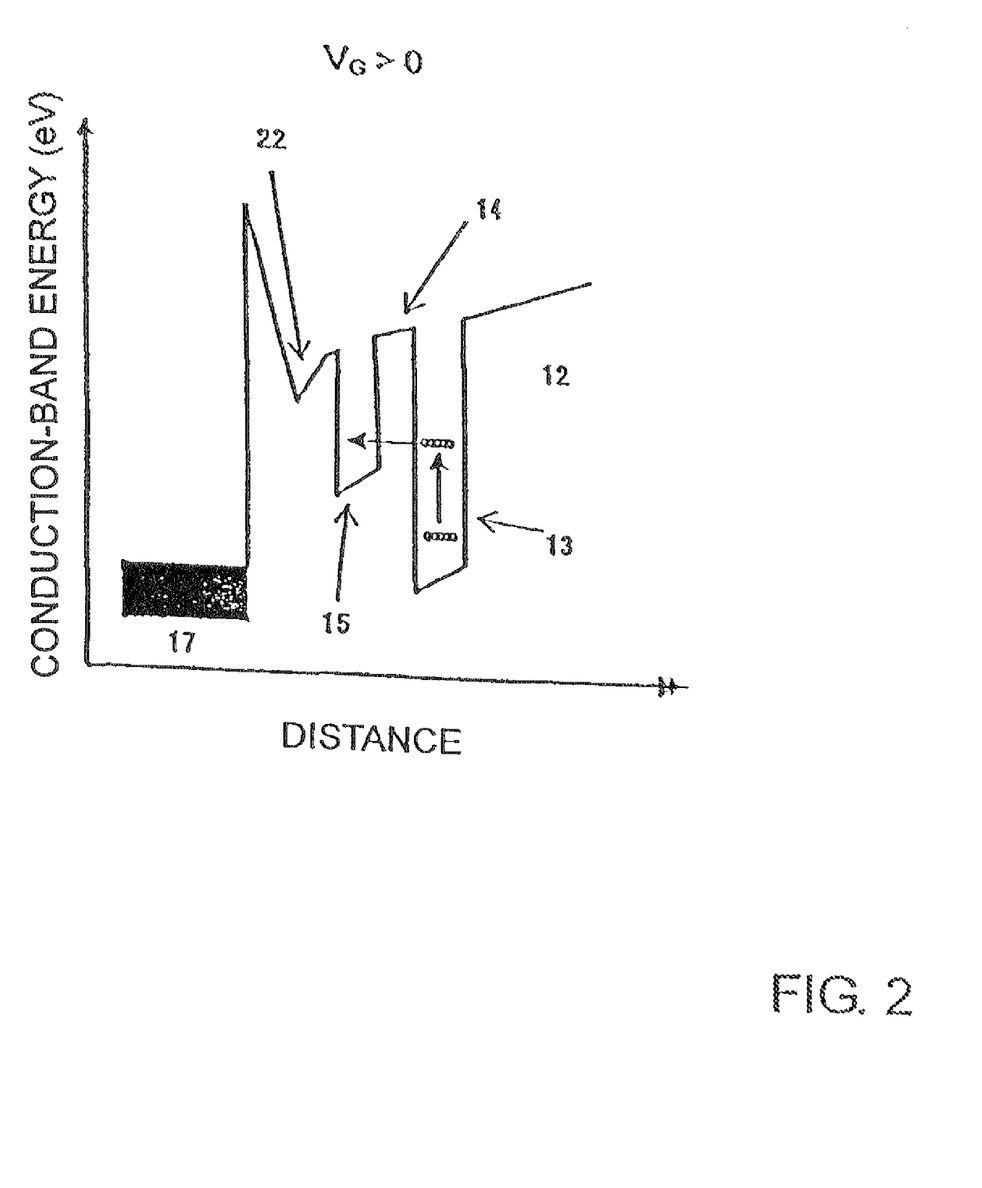
FIG. 2 An energy band view of the negative resistance field effect device.

FIG. 2 is an energy band view of the negative resistance field effect device 10. As shown in the drawing, a carrier in the high-mobility quantum well channel layer 13 accelerated by a drain voltage tunnels through or goes over the barrier of the InAlAs barrier layer 14 and transfers to the low-mobility quantum dot channel layer 15, and transits therein or stops. Here, $\mu(In_{0.53}Ga_{0.47}As$ quantum well$)\gg\mu(In_{0.23}Ga_{0.77}As$ quantum dot) is established.

Figure 3:
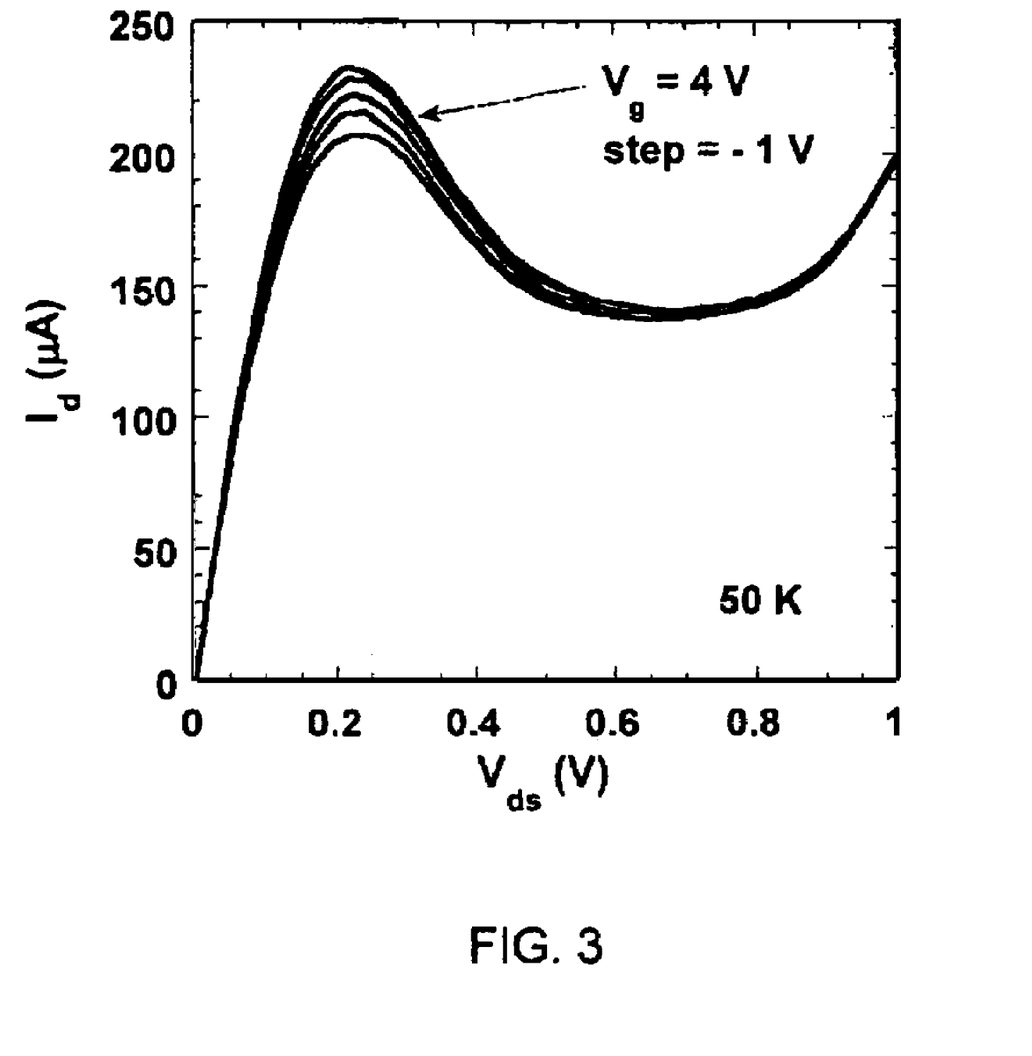
FIG. 3 A static characteristic view of drain-source voltage versus drain current obtained by the element of the negative resistance field effect device.

Next, FIG. 3 is a static characteristic view of drain-source voltage versus drain current obtained by the negative resistance field effect device.

When characteristics of the device formed in accordance with the embodiments in this way are variously measured, as shown in the drawing, a desirable characteristic can be obtained. The horizontal axis in the drawing indicates the drain-source voltage $V_{dS}$, and the vertical axis indicates the drain current $I_d$. The channel width is set to 800 nm, and the gate length is set to 200 nm. At an operation temperature of 50K, a clear negative differential resistance is observed. An onset voltage $V_{NDR}$ as a drain voltage at which the negative resistance occurs is 0.22 V at $V_g$=4V, and is sufficiently low as compared with the non-patent document 1. Besides, as compared with the patent documents 1 to 3, the invention is very excellent in the maximum current value, and in this embodiment, 230 µA is realized. In the patent document 2, it is restricted to approximately several tens µA, however, the invention succeeds in greatly increasing this. In this trial product, since the channel width is made as relatively thin as 800 nm, when it is made wide, the current value can be further increased. Although the PVCR is 1.63 at $V_g$=4V, for example, when the thickness of the quantum dot layer is made further thin, and the electron mobility of the low-mobility layer is further reduced, a high PVCR can be obtained (see FIG. 4 described later).

In FIG. 3, the negative differential resistance is changed by the gate voltage. Especially, the inclination of the negative resistance is increased with the gate voltage. The drawing shows a state in which the gate voltage $V_g$ is changed from 4 V by a step of –1V.

In general, in the case where a negative resistance device is applied as a high-frequency oscillation device, it is known that the oscillation frequency is determined by the inclination of the negative resistance. Accordingly, the negative resistance device of this embodiment can be applied as a variable frequency three-terminal high-frequency oscillation device.

Figure 4:
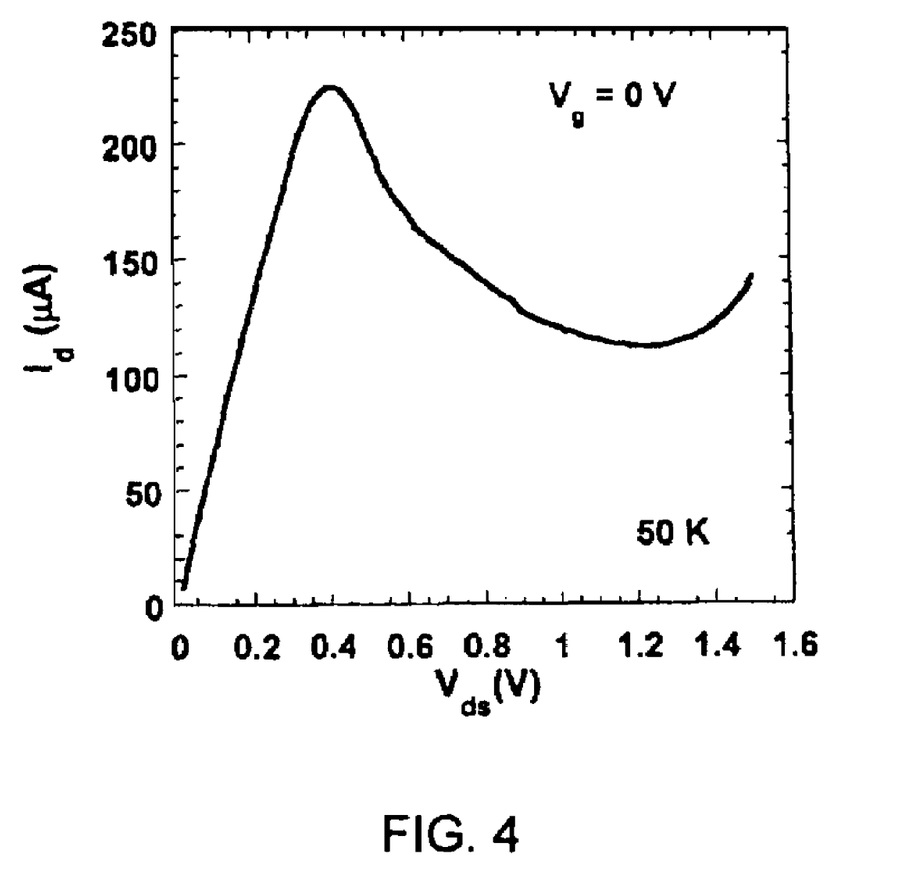
FIG. 4 A static characteristic view of drain-source voltage versus drain current of a device in which the sequence of a high-mobility quantum well layer and a low-mobility quantum dot layer is reversed.

FIG. 4 is a characteristic view of an device in which the high-mobility layer and the low-mobility layer of the double-channel structure is reversed. Growth on the substrate is performed in the order of a low-mobility quantum dot layer of 1 nm, a barrier layer of 2 nm, and a high-mobility quantum well layer of 10 nm. The gate voltage is 0 V. Also in this case, a clear negative differential resistance is observed, however, the onset voltage is as high as 0.4 V as compared with FIG. 3. It is conceivable that this is because, since the low-mobility quantum dot layer is as thin as 1 nm, and the energy level of an electron in the dot is high, energy required for a carrier to transfer to the low-mobility layer is large. Besides, by the influence of the low mobility of the quantum dot layer of 1 nm, the PVCR is 2.0 even at $V_g$=0 V.

INDUSTRIAL APPLICABILITY

Up to this point, the preferable embodiment of the invention has been described, and the negative differential resistance field effect device of the invention has merits that the three-terminal structure is very simple, the negative resistance is obtained at a low drain voltage, and the amount of current is made large, which were not achieved in the past. Further, the invention is expected to be applied to a high-frequency oscillator having an excellent negative differential resistance and low power consumption, a memory and the like.

The invention claimed is:

1. A negative resistance field effect device comprising:
   a source electrode and a drain electrode separate from each other;
   a dual-channel layer including a high-mobility channel quantum well layer and a low-mobility channel quantum dot layer that are respectively electrically connected to the source electrode and the drain electrode and are formed at both sides of a barrier; and
   a gate electrode that is provided between the source electrode and the drain electrode to face the dual-channel layer through a Schottky layer or an insulating film,
   wherein negative differential resistance is exhibited with respect to a drain current by transferring a carrier accelerated by a drain voltage applied to the drain electrode from the high-mobility channel to the low-mobility channel.

2. The negative resistance field effect device according to claim 1, wherein
   the quantum dot layer is made of a compound semiconductor having a lattice constant different from a substrate, has a thin thickness as compared with the quantum well layer, and has a low mobility.

3. The negative resistance field effect device according to claim 1, wherein
   the quantum dot layer has a thickness not larger than a critical thickness, has no roughness, is sufficiently thin, and has a sufficiently low electron mobility.

4. The negative resistance field effect device according to claim 1, wherein
   the quantum dot layer is made of a semiconductor layer lattice-matched to a substrate, has a sufficiently thin thickness and has a low electron mobility.

5. The negative resistance field effect device according to claim 1, wherein
   the quantum dot layer has many roughness on a surface, and has a low mobility.

6. The negative resistance field effect device according to claim 1, wherein
   the quantum well layer is lattice-matched to a substrate, and has a high mobility.

7. The negative resistance field effect device according to claim 1, wherein
   the quantum well layer is not lattice-matched to a substrate, has strain not relaxed, has a surface keeping a flat state, and/or has a high In composition and has a high mobility.

8. The negative resistance field effect device according to claim 1, wherein
   the quantum well layer and the quantum dot layer in the dual-channel are physically separate from each other by the barrier layer, but are close to each other such that a carrier can tunnel.

9. The negative resistance field effect device according to claim 1, wherein
   the low-mobility channel quantum dot layer is positioned at a side of the gate electrode when viewed from the high-mobility channel quantum well layer.

10. The negative resistance field effect device according to claim 1, wherein
    the quantum dot layer of the low-mobility channel is positioned at a side of the substrate when viewed from the high-mobility channel quantum well layer.

11. The negative resistance field effect device according to claim 1, further comprising a delta doped layer to supply a carrier at the gate electrode side of the dual-channel layer, the substrate side or both the sides.

12. The negative resistance field effect device according to claim 1, wherein
    an inclination of the negative resistance with respect to the drain current and a source/drain voltage can be controlled by a gate voltage.

13. The negative resistance field effect device according to claim 1, further comprising, between the dual-channel layer and the gate electrode, a gate Schottky layer of a laminate structure including a Schottky junction layer and a delta doped layer.

14. The negative resistance field effect device according to claim 1, further comprising, between the dual-channel layer and the source electrode and the drain electrode,
- a gate Schottky layer of a laminate structure including a Schottky junction layer and a delta doped layer, and
- a contact layer or a non-alloy contact layer of a laminate structure including a Schottky junction layer and a delta doped layer.

15. A high-frequency oscillation device comprising:
a negative resistance field effect device according to claim 1, wherein
an oscillation wavelength is made variable by controlling an inclination of a negative resistance with respect to a drain current and a source/drain voltage by a gate voltage.

16. A negative resistance field effect device comprising:
a substrate;
a dual-channel layer that is provided to be laminated on the substrate and includes a high-mobility channel quantum well layer and a low-mobility channel quantum dot layer formed at both sides of a barrier layer, in which although the quantum well layer and the quantum dot layer are physically separate from each other through the barrier layer, they are close to each other such that a carrier can tunnel,
a gate Schottky layer that is provided to be laminated on the dual-channel layer, and has a laminate structure including a spacer layer having an energy band gap relatively wide as compared with the dual-channel layer, a delta doped layer for carrier supply from a source side, and a Schottky junction layer or a gate insulating layer;
a gate electrode provided on the gate Schottky layer;
a contact layer that is provided to be laminated on the gate Schottky layer, has a good lattice matching property and good conductivity, has good ohmic contact with a source electrode and a drain electrode, and has a laminate structure including a delta doped layer and a Schottky layer; and
the source electrode and the drain electrode that are provided on the contact layer, and are provided to be separate from each other at both sides of the gate electrode,
wherein the dual-channel layer is electrically connected to the source electrode and the drain electrode through the contact layer and the gate Schottky layer, and negative differential resistance is exhibited with respect to a drain current by transferring a carrier accelerated by a drain voltage applied to the drain electrode from the high-mobility channel to the low-mobility channel.

* * * * *

UNITED STATES PATENT AND TRADEMARK OFFICE
CERTIFICATE OF CORRECTION

PATENT NO. : 7,652,310 B2 Page 1 of 1
APPLICATION NO. : 12/064371
DATED : January 26, 2010
INVENTOR(S) : Sugaya et al.

It is certified that error appears in the above-identified patent and that said Letters Patent is hereby corrected as shown below:

Column 4, line 14, cancel the text "element of the".

Signed and Sealed this

Twentieth Day of April, 2010

David J. Kappos
*Director of the United States Patent and Trademark Office*